(12) United States Patent
Whipple

(10) Patent No.: US 9,431,561 B1
(45) Date of Patent: Aug. 30, 2016

(54) METHOD AND SYSTEM FOR PROVIDING A WIND LOAD RESISTANT, TRACKING PHOTOVOLTAIC (PV) ARRAY

(71) Applicant: Samuel Whipple, Asheville, NC (US)

(72) Inventor: Samuel Whipple, Asheville, NC (US)

( * ) Notice: Subject to any disclaimer, the term of this patent is extended or adjusted under 35 U.S.C. 154(b) by 90 days.

(21) Appl. No.: 14/179,837

(22) Filed: Feb. 13, 2014

Related U.S. Application Data

(60) Provisional application No. 61/902,772, filed on Nov. 11, 2013.

(51) Int. Cl.
| | |
|---|---|
| *H02J 7/00* | (2006.01) |
| *H01M 10/44* | (2006.01) |
| *H01M 10/46* | (2006.01) |
| *H01L 31/052* | (2014.01) |
| *H01L 31/18* | (2006.01) |
| *H02J 7/35* | (2006.01) |

(52) U.S. Cl.
CPC ............ *H01L 31/052* (2013.01); *H01L 31/18* (2013.01); *H02J 7/35* (2013.01)

(58) Field of Classification Search
USPC ......................................................... 320/101
See application file for complete search history.

(56) References Cited

U.S. PATENT DOCUMENTS

| | | | | |
|---|---|---|---|---|
| 4,055,161 A * | 10/1977 | Jones | ......................... | F24J 2/14 126/580 |
| 2011/0220096 A1* | 9/2011 | Margankunte | ............. | F24J 2/07 126/684 |
| 2011/0271989 A1* | 11/2011 | Mendez De La Cuesta | .................... | B08B 3/024 134/198 |
| 2012/0004780 A1* | 1/2012 | Miller | ......................... | F24J 2/38 700/286 |
| 2012/0023841 A1* | 2/2012 | Renna | .................... | F24J 2/0455 52/173.3 |
| 2012/0057281 A1* | 3/2012 | Lee | .......................... | H02J 7/355 361/679.01 |
| 2013/0192659 A1* | 8/2013 | Upton | .................... | G01S 3/7861 136/246 |
| 2014/0246075 A1* | 9/2014 | Goldsby | ............. | H01L 31/0521 136/246 |

* cited by examiner

*Primary Examiner* — Bryce Aisaka
(74) *Attorney, Agent, or Firm* — Smith Tempel; Steven P. Wigmore

(57) ABSTRACT

A wind load resistant, tracking photovoltaic solar array system may include a pivot support; at least one solar cell coupled to the pivot support; and a pivot arm coupled to the solar cell for providing transverse movement of the solar cell relative to a longitudinal axis of the pivot support. A transverse drive motor may be coupled to the pivot arm for rotating the pivot arm in response to control signals. A tube for housing the solar cell, pivot arm, and the transverse drive motor may also be included. A support structure may be coupled to the tube and for mounting the tube against another structure, such as a building rooftop. A longitudinal axis drive motor may be coupled to the tube and the support structure. The longitudinal axis drive motor may rotate the tube around a geometrical longitudinal axis of the tube in response to control signals.

17 Claims, 8 Drawing Sheets

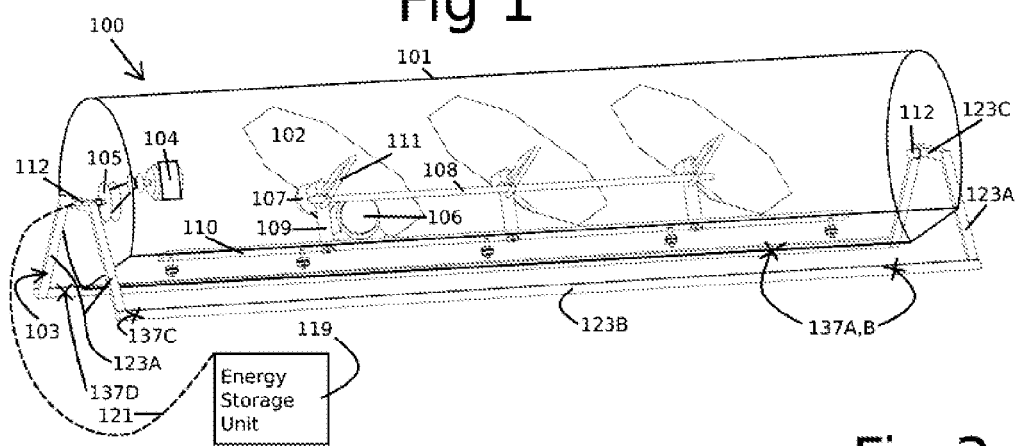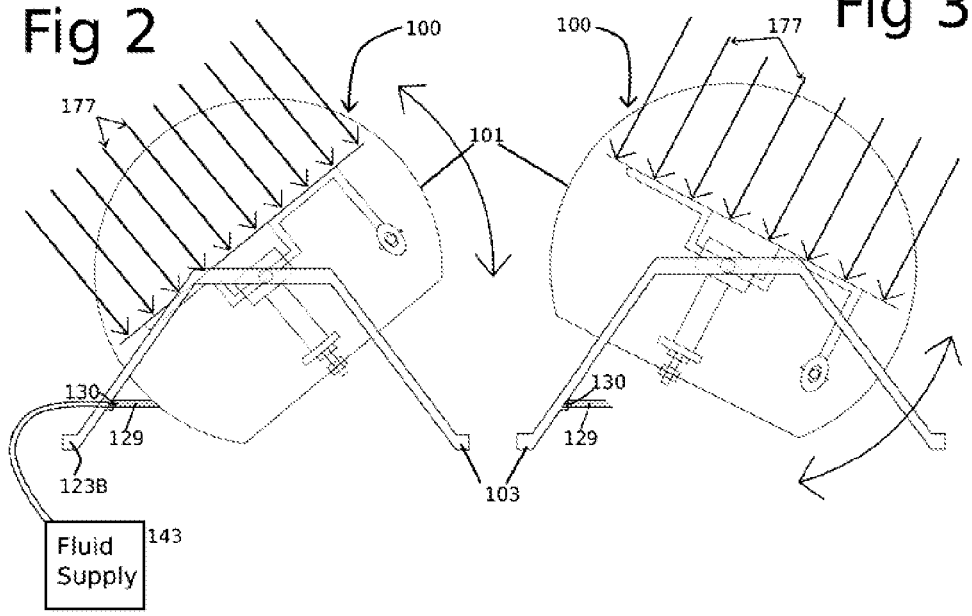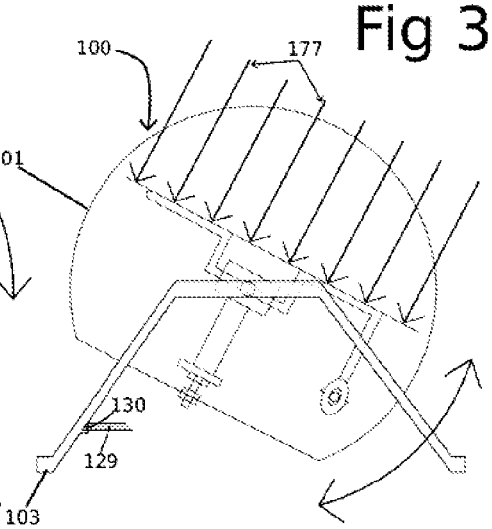

Fig 4
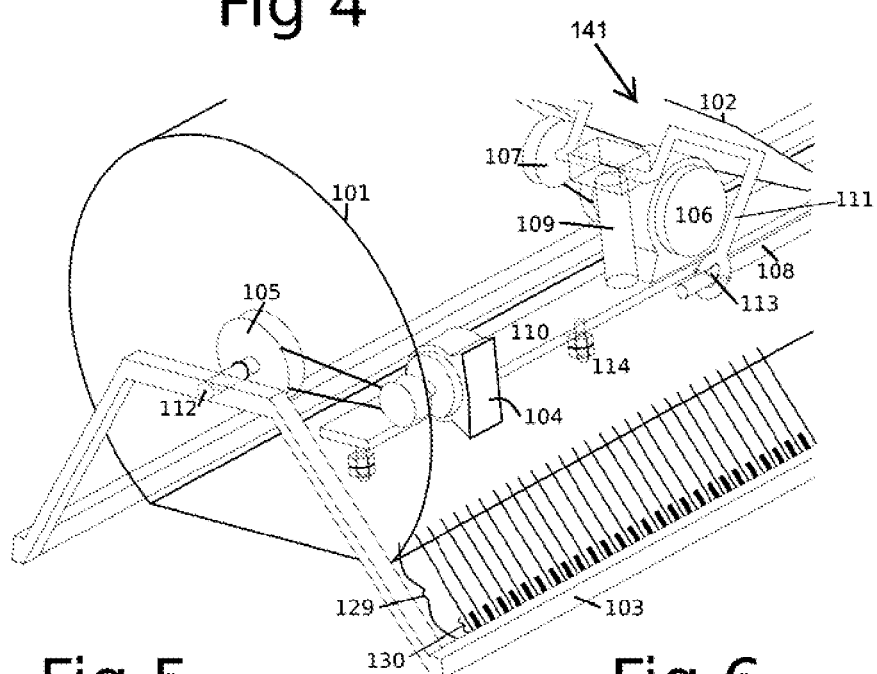
Fig 5
Fig 6
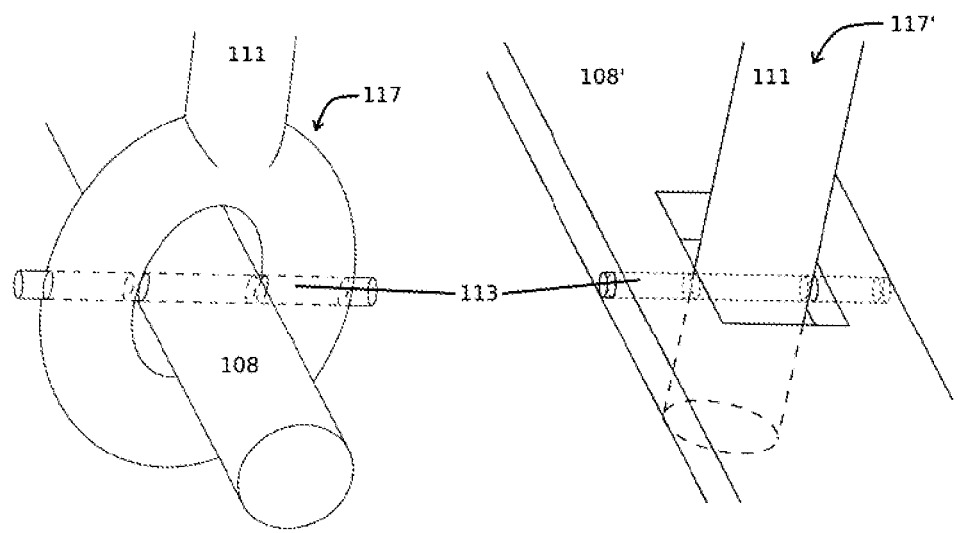

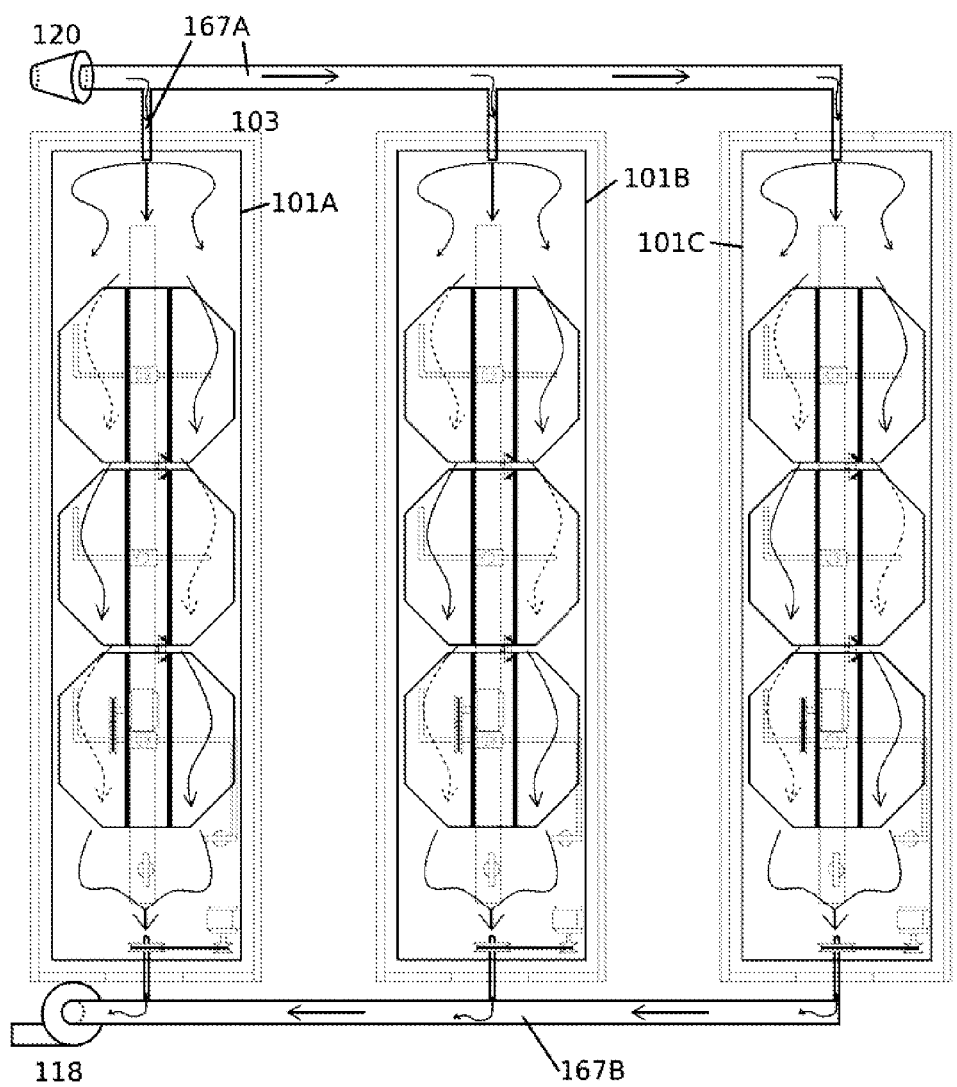

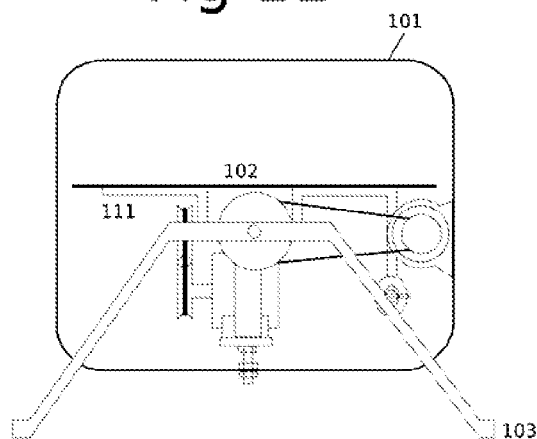
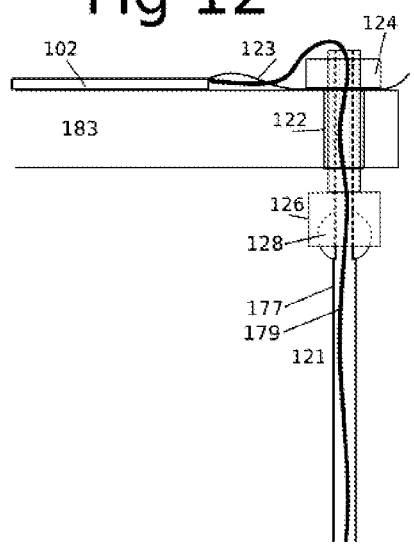
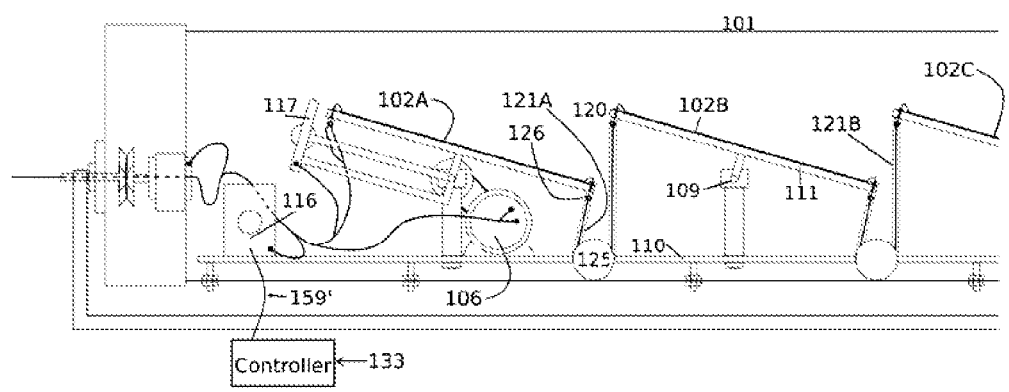

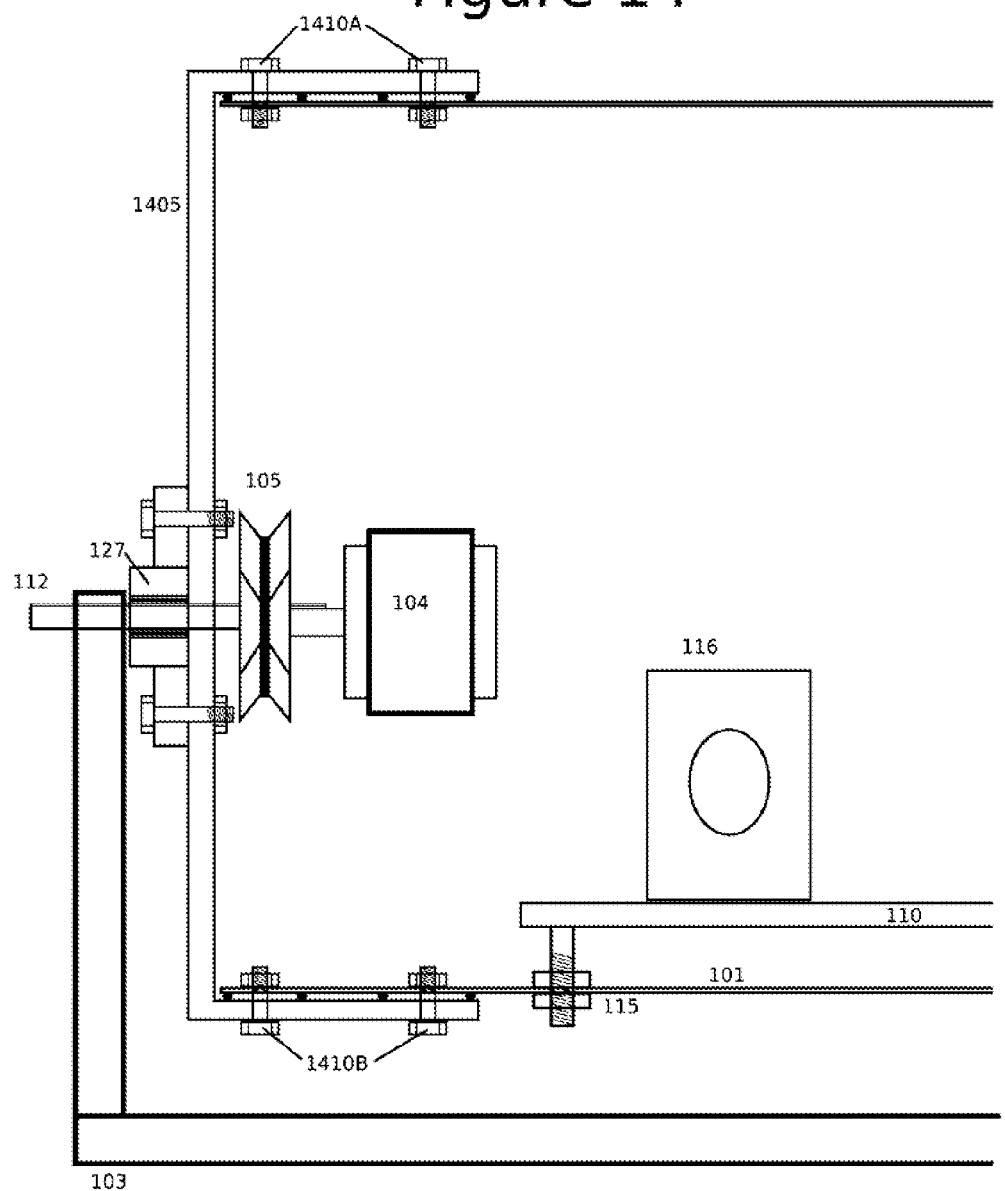

METHOD AND SYSTEM FOR PROVIDING A WIND LOAD RESISTANT, TRACKING PHOTOVOLTAIC (PV) ARRAY

RELATED APPLICATIONS STATEMENT

This patent application is a non-provisional of and claims priority under 35 U.S.C. §119(e) to U.S. Provisional Patent Application No. 61/902,772, filed on Nov. 11, 2013, entitled, "METHOD AND SYSTEM FOR PROVIDING WIND LOAD RESISTANT, TRACKING PHOTOVOLTAIC (PV) ARRAY," the entire contents of which are hereby incorporated by reference.

DESCRIPTION OF THE RELATED ART

Conventional solar tracking systems typically yield 45% more electrical energy than fixed solar panels, but are always disproportionally more expensive. This usually means technically inferior fixed/stationary systems are often settled for by the customer. Solar electrical energy power generation systems are usually placed on roofs of buildings. With the limited space of roofs, a maximum yield of power generation per unit area is paramount.

As of this writing, there are not any reasonably priced and easily installed tracking solar systems currently available for roof type installations. Conventional flat panel solar arrays are usually subjected to excessive wind loading when placed on building rooftops. To address wind loading for building rooftop applications, the drives and supports for tracking systems usually become cost prohibitive, unsightly, heavy, and technically difficult to install. Conventional tracking solar systems, because of their size and mechanical robustness to counter wind loading, generally need to be installed by specialized contractors.

Another issue with conventional solar power generation systems is their cost effectiveness. The present cost effectiveness analysis, as of this writing, for most conventional solar power generation systems are based on government subsidized photovoltaic systems. The need for government subsidies is a poor gesture for the viability of solar power.

What is needed in the art is a solar power generation system that is easily installed while boasting an encouraging payback period without any governmental subsidies.

SUMMARY OF THE DISCLOSURE

A wind load resistant, tracking photovoltaic solar array system may include a pivot support; at least one solar cell coupled to the pivot support; and a pivot arm coupled to the solar cell for providing transverse movement of the solar cell relative to a longitudinal axis of the pivot support. The system may also include a transverse drive motor coupled to the pivot arm for rotating the pivot arm in response to control signals. A tube for housing the solar cell, pivot arm, and the transverse drive motor may also be included. A support structure may be coupled to the tube and for mounting the tube against another structure, such as a building and specifically, a roof top of the building.

A longitudinal axis drive motor may be coupled to the tube and the support structure. The longitudinal axis drive motor may rotate the tube around a geometrical longitudinal axis of the tube in response to control signals. A controller may be coupled to at least one of the transverse axis drive motor and the longitudinal axis drive motor. At least one optical sensor may be coupled to the controller.

Each motor may be powered by energy generated by the solar cell. Each solar cell comprises a photovoltaic cell for producing electrical energy. An energy storage unit may be coupled to the solar cell for storing energy. The entire system may be provided as a kit for mounting on a building.

A method for providing a wind load resistant, tracking photovoltaic solar array system may include mounting a solar cell with a transverse axis adjustment system on a pivot base and providing a tube with a wind load resistant geometry. Next, the solar cell may be positioned on a pivot base within the tube. The solar cell may be secured within the tube while a longitudinal axis adjustment system is coupled to the cell and the tube.

Ends of the tube may be sealed with end caps and a support structure may be coupled to the tube. The solar array system may be fastened to a building, such as a rooftop of a building. Sunlight may be tracked with optical sensors within the tube in order to optimize power output of the solar array system. At least one of the transverse axis adjustment system and longitudinal axis adjustment system may be powered with the solar cell. Power generated by the solar cell may be stored in a storage unit, such as, but not limited to, a lead-acid battery array.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

In the figures, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

FIG. 1 illustrates one exemplary embodiment of a system for providing a wind load resistant, tracking photovoltaic (PV) array.

FIGS. 2 and 3 illustrate side views of a single tube of the system of FIG. 1 in addition to a cleaning device for cleaning a surface of the tube according to one exemplary embodiment.

FIG. 4 illustrates a perspective view of the tube of FIG. 1 and details for one exemplary embodiment of a longitudinal axis drive.

FIG. 5 illustrates one exemplary embodiment of a synchronizer rod and bracket joint assembly that is also illustrated in FIG. 4.

FIG. 6 illustrates an alternate exemplary embodiment for the synchronizer rod and bracket joint assembly.

FIG. 10 illustrates one exemplary embodiment in which three solar arrays within respective tubes are provided with an air inlet manifold and filter and an outlet manifold with a blower for cooling fluid flow.

FIG. 11 illustrates an exemplary embodiment of an alternative "boxfish" cowl geometry for a tube.

FIG. 12 illustrates an exemplary embodiment in which electrical connections between solar cells may also adjust physical orientation of a respective solar cell.

FIG. 13 illustrates further details of the embodiment of FIG. 12 in which existing wiring between solar cells may transmit and synchronize movement between supporting brackets of respective solar cells.

FIG. 14 illustrates an exemplary embodiment in which details for sealing and fitting the end caps are shown.

DETAILED DESCRIPTION

Figure 7:
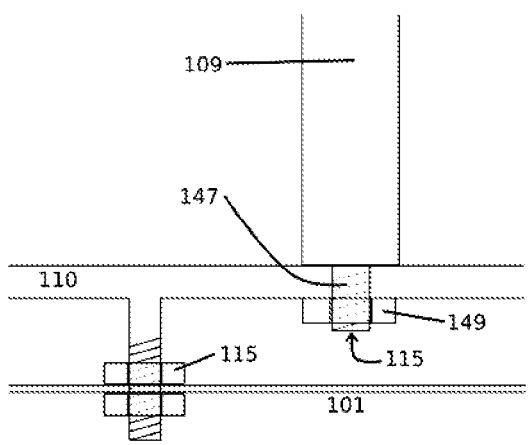
FIG. 7 illustrates a front view of mounts for the pivot support posts which may provide a pivotal base for each photovoltaic cell.

The word "exemplary" is used herein to mean "serving as an example, instance, or illustration." Any aspect described herein as "exemplary" is not necessarily to be construed as preferred or advantageous over other aspects.

FIG. 1 illustrates one exemplary embodiment of a single tube 101 and structural support assembly 103 containing a plurality of photovoltaic solar cells 102. Specifically, FIG. 1 illustrates one exemplary embodiment of a system 100 for providing a wind load resistant, tracking photovoltaic array. The system 100 may comprise the tube 101, the support structure 103, and a plurality of photovoltaic solar cells 102.

The tube 101 may have a cross-sectional shape which has a substantially circular portion with a flat portion. The flat or planar portion of the tube 101 may comprise a pivot base 110 described in further detail below. This shape of the tube 101 in addition to its relative size (described below) may provide for low wind drag compared to other comparable and conventional photovoltaic arrays which may be bulky/large having rough and/or ragged edges.

The inventive system 100 having tube 101, which acts as a protective cover, is not limited to this particular cross-sectional shape. Other cross-sectional shapes for the tube 101 which may provide for low wind drag include, but are not limited to, substantially rectangular with rounded corners, elliptical, semi-circular, substantially circular, pentagonal, octagonal, and other like polyhedronal shapes.

The system 100 may further comprise a support structure 103 that includes a pivot member 112 in addition to angled support beams 123A and base support beams 123B. The pivot member 112 may comprise a bearing rod assembly that is coupled to a transverse support beam 123C. The pivot member 112 may be coupled to a pulley 105.

The longitudinal axis motor 104 is designed to rotate the entire tube 101 about a geometrical longitudinal axis that runs along the length of the tube 101. Specifically, the pulley 105 remains stationary and does not move while the motor 104 rotates its pulley that is coupled to a belt drive. As the motor 104 rotates its pulley, this moves the tube 101 around the axis of the pulley 105 coupled to the pivot member 112. Further details of the pivot member 112, pulley 105, and longitudinal axis motor 104 are illustrated in FIG. 4 and are described below.

The system 100 may further comprise a pivot base 110 that may define a substantially planar surface relative to the tube 101. The pivot base 110 may support a plurality of pivot support rods 109 which may provide direct mechanical and physical support for each photovoltaic cell 102.

Figure 8:
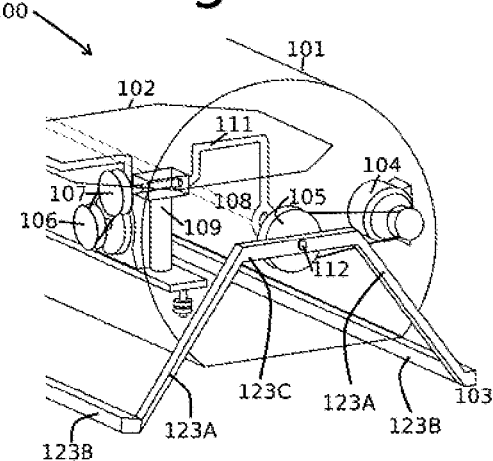
FIG. 8 illustrates an exemplary embodiment of a transverse axis drive mechanism and a master bracket for the tube of FIG. 1.
Figure 9:
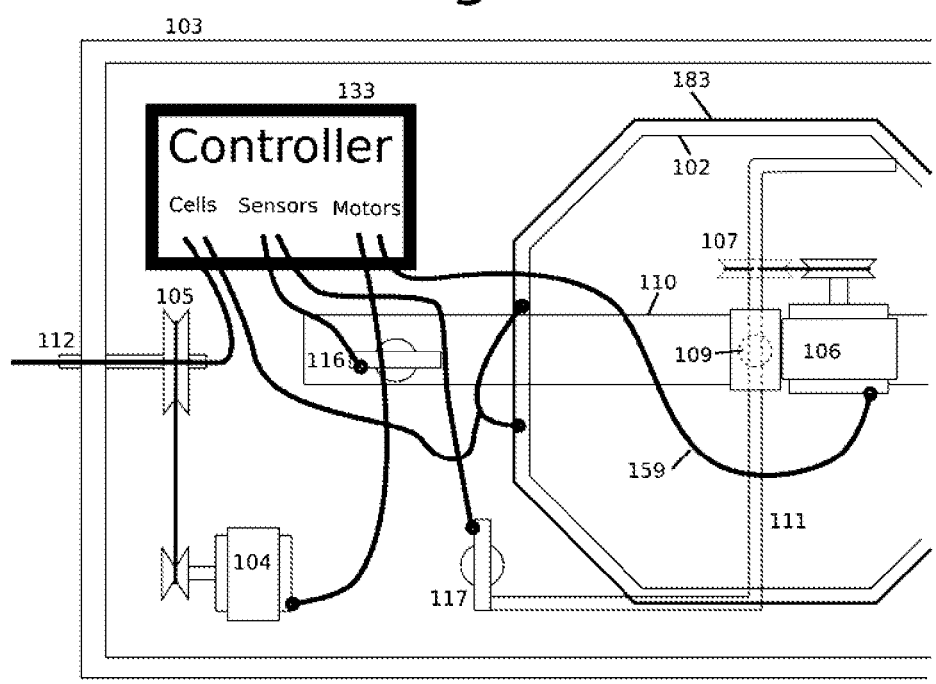
FIG. 9 illustrates an exemplary embodiment of mounting and orientation for optical sensors as well as wiring for drive motors, sensors and a solar cell found in the tube of FIG. 1.

The pivot support rods 109 may be coupled to master pivot arm 141 and pivot arms 111 that provide rotation for each photovoltaic cell 102 (and/or cell support 183) about a transverse axis which is defined as the geometrical axis perpendicular to the longitudinal axis/longest axis of the tube 101. The master pivot arm 141 is rotated by a transverse axis drive motor 106. Further details about the master pivot arm 141, pivot arms 111, pivot support rods 109, and transverse axis drive motor 106 are illustrated in FIGS. 4, 8, 9 described below.

Each of the photovoltaic cells 102 is electrically coupled to an output line 121 which is fed outside of the tube 101 and coupled to an energy storage unit 119. The energy storage unit 119 may comprise any one or a combination of energy storage technologies, such as, but not limited to, a lead acid battery array, a fuel cell, a large mechanical flywheel, and the like as understood by one of ordinary skill the art.

Each photovoltaic cell 102 may be made from at least one of monocrystalline silicon, polycrystalline silicon, amorphous silicon, cadmium telluride or copper indium selenide/sulfide, or a GaAs-based multijunction material system. Specifically, each photovoltaic cell 102 may be made from monocrystalline silicon (c-Si); polycrystalline silicon (poly-Si); multicrystalline silicon (mc-Si); ribbon silicon; mono-like-multi silicon; thin films such as Cadmium telluride (CdTe), copper indium gallium selenide (CIGS) and amorphous silicon (a-Si); Cadmium telluride; Copper indium gallium selenide; GaAs thin films; Amorphous silicon (a-Si or a-Si:H); Nanocrystalline silicon (nc-Si or nc-Si:H), also called microcrystalline silicon; and multi-junction, just to name a few.

Each photovoltaic cell 102 may have a surface area of about 9.0 square inches. In the exemplary embodiment illustrated in FIG. 1, each photovoltaic cell 102 is illustrated with an octagonal shape. However, other shapes are possible and are within the scope of this disclosure. Other shapes include, but are not limited to, square, triangular rectangular, elliptical, circular, pentagonal, hexagonal, and other similar polyhedral shapes.

Each tube 101 may be designed to have a predetermined number of photovoltaic cells 102 which may produce approximately 75.0 Watts of electrical power depending on solar intensity for a given period of time for sun exposure. However, other scaling/capacities for the electrical output of each tube 101 may be provided and are within the scope of this disclosure.

Each tube 101 may have a diameter between about 5.0 inches to about 6.0 inches and a length between about 5.0 feet and about 7.0 feet. Generally, each tube 101 may comprise between about four to about eight photovoltaic cells 102. Typically, each tube 101 is sold or packaged separately relative to other tubes 101. However, other packaging amounts/configurations are understood by one of ordinary skill the art and are within the scope of this disclosure.

Each tube 101 is transparent with respect to its color such that light rays from the sun may easily penetrate through the tube material and strike each respective photovoltaic cell 102. The tube material may comprise a form of plastic such as UV stabilized polycarbonate, ABA, PLA, PVC and other like polymers. Also a durable glass enclosure such as borosilicate, fused quartz or similar silicates may provide superior scratch and UV resistance1.

One advantage of the system 100 is that all of the photovoltaic cells 102 are positioned within a single housing

101. The system 100 is a mechanically simple and is manageable with respect to its size. The size of the tube 101 allows an average consumer to install the simple array his or herself with hand tools such as a hammer and screwdrivers. The system 100 provides a lightweight package which is relatively easy to install compared to complex mechanical systems described in the conventional art which require sophisticated mechanical systems and professional installation.

With this system 100, the consumer may simply secure for fastening points 137A-D which may be positioned along the base support beams 123B. The four fastening points 137A-D may be secured to most planar/flat surfaces with relative ease, such as to a roof of a building. Exemplary fasteners which may be employed include, but are not limited to, screws, bolts, brackets, nails, rivets, and other like fasteners. If mounted to a paramagnetic surface such as a steel roof, sufficient strength magnets may suffice for a simple means of installation. Such magnets should be of the rare earth type such as neodymium ($Nd_2Fe_{14}B$).

As noted above, it is one intent of the system 100 to allow the average consumer to install the system 100 using ordinary hand tools such as a screwdriver, wrench, and/or hammer. The approximate weight for a respective tube 101 which has a length of about 6.0 feet and a diameter of about 6.0 inches is usually about 22.0-33.0 pounds (10.0-15.0 kg). An important note regarding the assembly's mass is that it should be a balanced rotating assembly to reduce motor load substantially and hence motor cost, size, and reliability.

Specifically, the cells 102 and the motors 104, 106 are positioned such that the system 100 takes advantage of center of gravity in which the amount of power and amount of effort needed to rotate the tube 101 by motor 104 and to rotate the cells 102 by motor 106 is substantially minimized. A balanced rotating assembly, that includes the tube/housing 101 may significantly reduces motor requirements (i.e. motor size, type, and power consumption, etc.).

According to one exemplary embodiment, an inertial load center of gravity may be positioned on the datum line formed by pivot member 112. The positioning/placement of drive motors may play a key role in establishing a deliberate center of gravity that facilitates rotation of the tube/housing 101 along its longitudinal axis. Dimensions of components may be determined by the desired level of balance from the center of gravity. Pivot base 110 may be key component to decide dimension and material based on balancing needs.

The system 100 offers a self-contained, self configuring unit which is ready for use once the consumer installs each respective tube 101. Basically, the ordinary consumer can install a single tube 101 with a hammer and/or screwdriver, hook-up (couple) the power connections 119, 121 to the housing 101 and be ready to produce electrical power with the system 100 fairly quickly.

As noted above, because of the respective small size of the tubes 101 and their respective geometry, the system 100 does not provide any significant wind drag or wind resistance compared to other solar energy systems which are often rather bulky and are susceptible to wind damage and/or wind shear.

The pivot base 110 which supports each respective pivot support rod 109 as illustrated in FIG. 1 is preferably made of metal, such as, but not limited to, aluminum or steel. However, other materials besides metals are possible and may include ceramics, plastics, etc. All remaining materials of the system 100 not specifically identified and illustrated in the several figures may be made from any combination such as metals, non-metals, ceramics, etc. as long as each material may withstand heat and sunlight (ultraviolet radiation) associated with photovoltaic power generation as understood by one of ordinary skill the art.

Referring now to FIGS. 2 and 3, these two figures illustrate side views of a single tube 101 in addition to a cleaning brush 129 and water jet 130 for cleaning a surface of the tube 101 according to one exemplary embodiment. The cleaning device 129,130 may comprise a brush 129 which contacts a surface of a respective tube 101. The cleaning device 129,130 may also support the dispensing of a fluid, such as air or water, and may be coupled to a fluid supply 143. The fluid supply 143 may comprise water or air. In water applications, the fluid supply 143 may comprise a conventional water spigot of a building coupled to a garden hose.

FIGS. 2-3 illustrate some light rays 177 that penetrate the tube 101 and strike a surface of each photovoltaic cell 102. During a cleaning operation, the longitudinal axis motor 104 of FIG. 1 may rotate the tube 101, as indicated by the curved arrows in these two figures, for an amount of approximately 360.0° or close to that amount in order to rotate the tube 101 such that the cleaning brush 129 may contact or touched the entire surface of the tube 101 for scraping off debris and/or washing off or blowing off debris with the fluid from the fluid supply 143.

Referring now to FIG. 4, this figure illustrates a perspective view of the tube 101 of FIG. 1 and details for one exemplary embodiment of a longitudinal axis drive that includes motor 104 and pulley 105. The motor 104 is coupled to a surface of the tube 101. Meanwhile, the pulley 105 is coupled to the pivot member 112. Therefore, when the motor 104 rotates the tube 101 around the pulley 105, this motion causes the tube 101 to rotate about the longitudinal axis as desired.

FIG. 4 also illustrates details of the transverse axis drive motor 106 and a synchronizer rod 108. The transverse axis drive motor 106 is coupled to another pulley 107. The pulley 107 is coupled to the master pivot arm 141. So when the transverse axis drive motor 106 rotates the pulley 107, this causes the plurality of cells 102, master pivot cell 141, pivot arms 111 and/or cell support 183 to rotate in a transverse manner (ninety degrees) relative to the longitudinal axis of the tube 101.

The cell support 183 may comprise a planar sheet having a geometry similar to a shape of a cell 102 but having a larger surface area and perimeter. The cell support 183 can be made out of any material, such as, but not limited to metals or non-metals. The cell support 183 generally has better tensile and compression strength characteristics compared to the silicon materials generally forming each cell 102.

For many of the motors which exist within each tube 101, such as the transverse axis drive motor 106 of FIG. 1, such motors 106 are preferably direct current stepper motors. However, other motors are possible and are included within the scope of this disclosure such as, but not limited to, a brushless DC motor, a switched reluctance motor, a induction motor, a torque motor, a synchronous motor, a rotary motor, hydraulic cylinder displacement motor, an ironless or coreless rotor motor, a pancake or axial rotor motor, servo motor, and linear motor type motors. Each motor 104, 106, such as the transverse axis drive motor 106 and the longitudinal axis drive motor 104 of FIG. 1 may consume power on the order of approximately 5.0 milliwatts. This power value may be calculated by adding inertial and frictional load of a 15 kg, 15 cm diameter tube of a concentric, balanced mass.

According to one exemplary embodiment, power for each motor, such as the transverse axis drive motor 106, within each tube 101 is generated by the photovoltaic cells 102 themselves. In other words, each motor within each tube 101 is powered by the solar cells 102 present within the tube 101 and/or energy taken from the storage unit 119. Therefore, with the self-contained unit or tube 101, the ordinary consumer does not need to be concerned with any electrical hookups for powering each respective motor 104, 106 within a tube 101.

In other and less preferred embodiments, an external power source, such as alternating current originating from a building, may be provided for supplying energy to the motors 104, 106 of a respective tube 101. In such exemplary embodiments, each tube 101 may be provided with a single electrical cord for coupling to an A/C power source.

FIG. 5 illustrates one exemplary embodiment of a synchronizer rod 108 and bracket joint assembly 117 that is also illustrated in FIG. 4. The synchronizer rod 108 and bracket joint assembly 117 allow each of the photovoltaic cells 102 to move in tandem/in parallel with respect to each other. In other words, and now referring back to FIG. 1, the single transverse drive motor 106 may rotate pulley 107 which then in turn rotates the master pivot arm 141 of a first photovoltaic cell 102. The master pivot arm 141 has the bracket assembly 117 as illustrated in FIG. 5. When the master pivot arm 141 rotates, it exerts a force on the pivot pin 113 which then in turn rotates and moves the synchronizer rod 108.

This motion is translated directly to the slave pivot arms 111 that correspondingly index each cell 102 and/or cell support 183. According to this exemplary embodiment, the synchronizer rod 108 comprises a solid cylindrical member.

Referring now to FIG. 6, this figure illustrates an alternate exemplary embodiment for the synchronizer rod 108' and bracket joint assembly 117'. According to this exemplary embodiment, the synchronizer rod 108 prime comprises a flat rectangular member, compared to the solid cylindrical member as illustrated in FIG. 5. Other than these geometrical differences, the exemplary embodiment of FIG. 6 functions similarly to the embodiment illustrated in FIG. 5.

FIG. 7 illustrates a side view of mounts for the pivot support posts 109 which may provide a pivotal base for each photovoltaic cell 102. The pivot support rods 109 may be coupled to the substantially planar pivot base 110 by threaded bolt assemblies 115 in which each support rod 109 may have a threaded end portion 147 which couples with a nut 149.

However, other mechanical couplings are possible and are included within the scope of this disclosure as understood by one of ordinary skill in the art. Similar to the pivot support rods 109, the pivot base 110 may also comprise threaded bolt assemblies 115. As noted above, the materials for each of these elements may comprise nonmetals and/or metal material as understood by one of ordinary skill in the art.

FIG. 8 illustrates an exemplary embodiment of a transverse axis drive mechanism and a master bracket/pivot base 110 for the tube of FIG. 1. FIG. 8 illustrates how the pivot base 110 may be formed of a rectangular member which has a substantially narrow width relative to its length dimension. As noted previously, the pivot base 110 may be formed from either metals or nonmetals as understood by one of ordinary skill in the art.

FIG. 9 illustrates an exemplary embodiment of mounting and orientation for optical sensors 116, 117 as well as wiring 159 for drive motors 104, 106 and a solar cell 102 found in the tube 101 of FIG. 1. Each optical sensor 116, 117 may comprise one or more photo transistors. Each optical sensor 116, 117 is coupled to a controller 133 which is also coupled to respective drive motors 104 and 106.

If sunlight strikes one side of optical sensors 116/117 and not the other side, the controller 133 will power an appropriate motor 104, 106 such that sunlight will strike both sides of optical sensors 116/117. In other words, the array within the tube 101 is oriented by the motors 104/106 working under control from the controller 133 such that the array will be in direct alignment with incident sunlight as understood by one of ordinary skill the art.

Each controller 133 may comprise a solid-state application specific integrated circuit and/or a central processing unit as understood by one of ordinary skill the art. The longitudinal axis optical sensor 116 may be responsible for tracking sunlight that is parallel to the longitudinal axis while the transverse axis optical sensor 117 may be responsible for tracking sunlight that is parallel to the transverse axis as understood by one of ordinary skill in the art.

The wiring scheme illustrated in the exemplary embodiment of FIG. 9 further illustrates how each photovoltaic cell 102 may have a portion of its power being fed into the power inputs for a respective motor 104, 106. As noted previously, each motor 104, 106, such as the transverse axis drive motor 106 and the longitudinal axis drive motor 104 of FIG. 1 may consume power on the order of approximately 5.0 milliwatts, which is well within the output capacity of the array of photovoltaic cells 102.

FIG. 10 illustrates one exemplary embodiment in which three solar arrays within respective tubes 101A, 101B, and 101C are provided with an air inlet manifold 167A and filter 120 and an outlet manifold 167B with a blower 118 for cooling fluid flow. As understood by one of ordinary skill the art, because the photovoltaic cells 102 use sunlight for power generation, this same sunlight may produce significant amounts of heat within enclosed structures such as tubes 101.

To mitigate significant thermal loading on the photovoltaic cells 102, the blower 118 may circulate a fluid, such as air, across each photovoltaic cell 102 within a respective tube 101. The blower 118 may pull air across each cell 102 from the air inlet manifold 167A to the air outlet manifold 167B. While the blower 118 has been illustrated at the outlet manifold 167B, the blower 118 may easily be coupled to the air inlet manifold 167A in order to push or blow air across the photovoltaic cells 102.

FIG. 11 illustrates an exemplary embodiment of an alternative "boxfish" cowl geometry for a tube 101. According to this exemplary embodiment, each tube 101 may have a substantially rectangular cross section with rounded corners as illustrated in FIG. 11. This exemplary embodiment of FIG. 11 may substantially reduce when drag as understood by one of ordinary skill the art. As noted previously, other cross-sectional shapes for the tube 101 which may provide for low wind drag include, but are not limited to, substantially rectangular with rounded corners, elliptical, semicircular, substantially circular, pentagonal, octagonal, and other like polyhedral shapes.

Referring now to FIG. 12, this figure illustrates an exemplary embodiment in which electrical connections 121 between solar cells 102 may also adjust physical orientation of a respective solar cell 102. Specifically, each solar cell 102 may be supported by a cell support 183. The materials chosen for the cell support 183 generally include those which are not sensitive to thermal expansion and may support mechanical loads better than silicon, the predominant material in the cells 102.

While each cell 102 is resting on a cell support 183, each cell 102 may be electrically coupled to a locking nut 124 via a conductive strip 123. The locking nut 124 is coupled to a cable 121. The cable 121 may comprise a sheathing/conduit/cover 177 and a central conductor member 179. One portion of the cable 121 may comprise a ball 128 while another portion may comprise a socket joint 126 for receiving the ball 128.

The cable 121 may have a conductive outer sheathing and a conductive inner core. In this way, the cable 121 may conduct two different signals which could also be of opposite polarities such as positive and negative current. Alternatively, each cable 121 may be designed to support only one signal or one polarity when each solar array 102 has cables 121 coupled at two opposite ends, such as first end A and second end B, as illustrated in FIG. 13. In such an exemplary embodiment, the photovoltaic cells one or two may be coupled electrically in series as understood by one of ordinary skill in the art.

With the mechanical exemplary embodiment illustrated in FIG. 12, the electrical connections 121 may serve at least two functions: (A) a mechanical coupling between the respective cells 102 for rotating each cell along its respective transverse axis relative to the longitudinal axis of the tube 101; and (B) providing electrical connections between respective photovoltaic cells 102. The mechanical advantages of the exemplary embodiment illustrated in FIG. 12 will be described in further detail below in connection with FIG. 13. Compared to FIG. 1, the cable 121 has mechanically eliminated the master pivot arm 111 of FIG. 1. Also, the details for coupling respective photovoltaic cells 102 together electrically has not been illustrated for brevity.

FIG. 13 illustrates further details of the embodiment of FIG. 12 in which existing wiring between solar cells 102 may transmit and synchronize movement between supporting brackets of respective solar cells 102. Specifically, each cable 121 may be coupled to an intermediate pulley 125 which provides for relative rotational movement between respective cells 102. For example, when the transverse axis motor 106 rotates the pulley 107, this causes a first cell 102A to rotate. A cable 121A is coupled at the end of the first cell 102A. The cable 121A is coupled both to an end of the first cell 102A as well as an intermediate pulley 125. The intermediate pulley 125 is coupled to the first cable 121A and a second cable 121B.

When the first cable 121A is driven downwards, this movement rotates the pulley 125 and a counterclockwise rotation which moves the second cable 121B1 in an upward fashion. The second cable 121B is coupled to an end of a second solar cell 102B. In this way, the movement of the first cell 102A is relayed/communicated across the remaining cells 102 within the tube 101 which are coupled together with the combination of the cables 121 and intermediate pulleys 125. One of ordinary skill in the art will appreciate that the system 100 is not limited to cables 121 and pulleys 125. Other mechanical equivalents exist, such as solid rods with various types of mechanical linkages, and are within the scope of this disclosure.

FIG. 14 illustrates an exemplary embodiment in which details for sealing and fitting end caps 1405 are shown. Each end cap 1405 is removable to faceplate servicing of the cells 102 and/or motors 104, 106. Each cap 1405 may be fastened to a respective tube 101 at two regions at an end of a tube 101. A first region may exist adjacent to the pivot base 110. In this region, the end cap 1405 may be fastened to the tube 101 with bolts 1410A. Similarly, a second region opposite to the first region at the top of the tube 101 may include a second set of bolts 1410B for fastening the end 1405 to the tube 101.

As noted previously, the inventive system 100 is not limited to the fasteners illustrated. Other fasteners include, but are not limited to, screws, rivets, welds, nails, glues, polymers, and other like fastening mechanisms as understood by one of ordinary skill the art.

Figure 15:
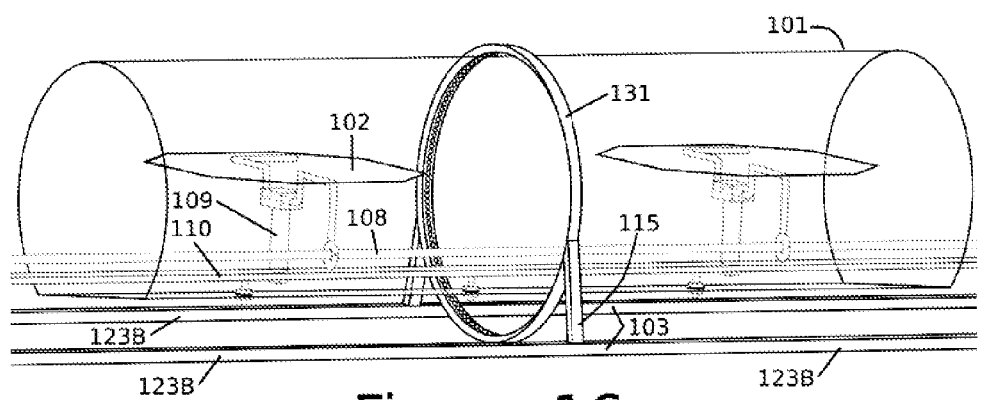
FIG. 15 illustrates an exemplary embodiment in which an optional rotary bearing is provided for a tube.

FIG. 15 illustrates an exemplary embodiment in which an optional rotary bearing 131 is provided for a tube 101. The rotary bearing 131 may be attached to a top portion of the tube 101 but not to a bottom portion of the tube 101. The inner race of rotary bearing 131 may be attached by an adhesive such as a glue or polymer. The rotary bearing 131 is usually not designed to support the weight of the tube 101 but rather to facilitate smooth rotation of the tube 101 when the longitudinal axis motors 104 are activated. In some exemplary embodiments, the base support beams 123 in combination with the angled support members 115 may provide for the sole direct support of the tube 101 such that the tube 101 is pushed against the portions of the rotary bearing 131 without any fastening mechanisms or coupling mechanisms provided between the rotary bearing 131 and the tube 101.

Figure 16:
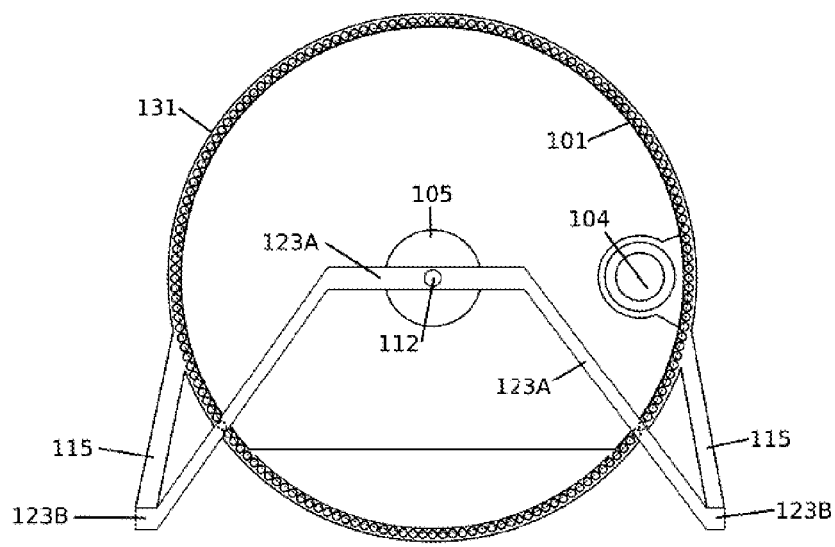
FIG. 16 illustrates a side view of the exemplary embodiment of FIG. 15.

FIG. 16 illustrates a side view of the exemplary embodiment of FIG. 15. Specifically, FIG. 16 illustrates the rotary support bearing 131 in addition to the longitudinal axis motor 104 and its pulley 105. The rotary support bearing 131 may assist with rotation of longer tubes 101 compared to the embodiments illustrated in FIG. 1. In other words, for significantly longer tubes 101 such as on the order of about 8.0 feet to about 12.0 feet, the support bearing 131 may assist in rotating the entire tube 101 and work in conjunction with the pivot members 112 and longitudinal axis motor 104 as illustrated in FIG. 1. The support bearing 131 may not provide any upward support with respect to the underneath portion of each respective tube 101.

Figure 17:
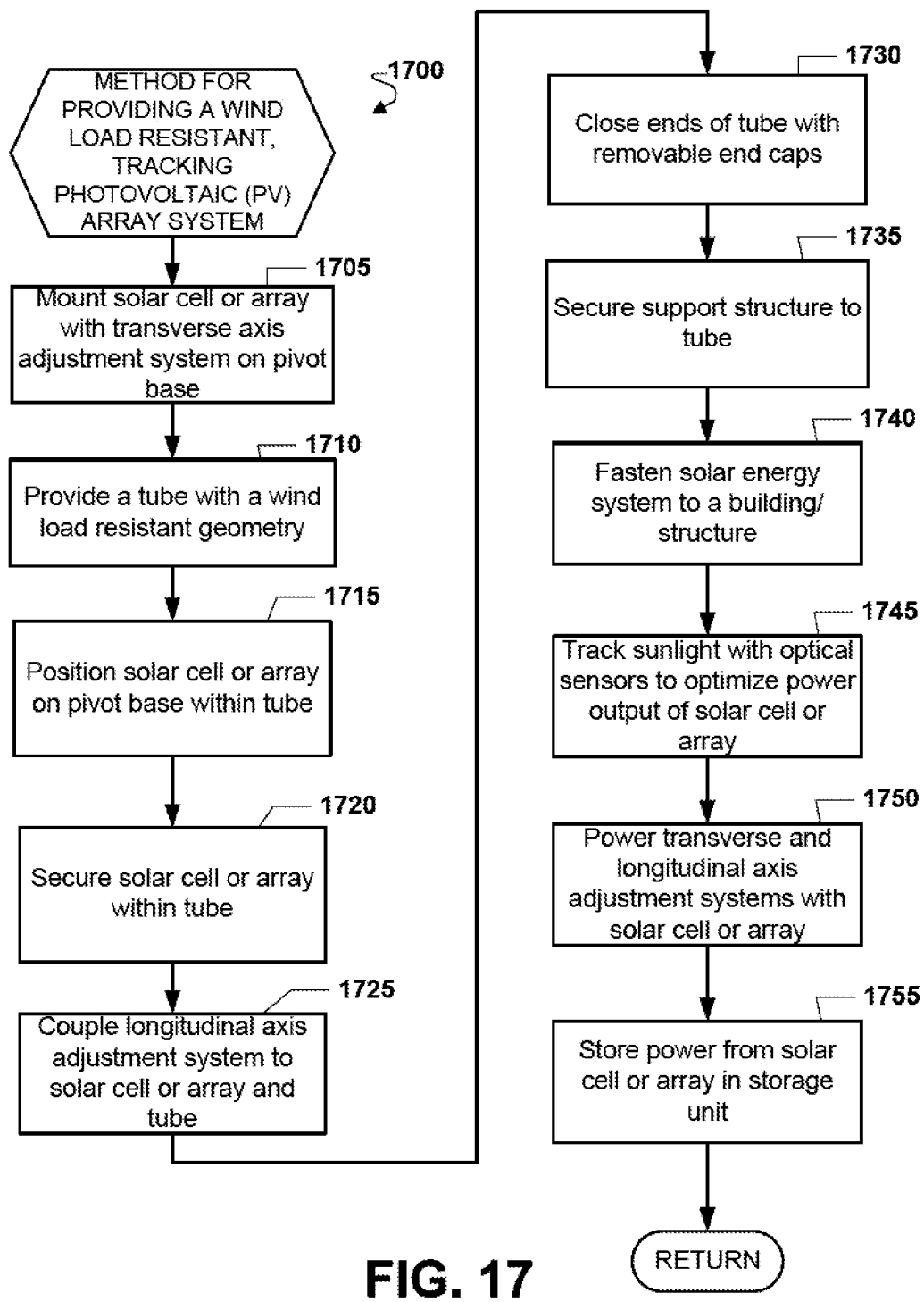
FIG. 17 is a flow chart illustrating a method for providing a wind load resistant, tracking photovoltaic array.

FIG. 17 is a flow chart illustrating a method 1700 for providing a wind load resistant, tracking photovoltaic array. Block 1705 is the first step of method 1700. In block 1705, one or more photovoltaic solar cells 102 may be mounted with a transverse axis adjustment system, that may include a motor 106, onto a pivot base 110. Next, a tube 101 may be provided having a wind load resistant geometry.

As noted above, the tube 101 may have a cross-sectional shape which has a substantially circular portion with a flat portion. The flat or planar portion of the tube 101 may comprise a pivot base 110 described above. This shape of the tube 101 in addition to its relative size (described below) may provide for low wind drag compared to other comparable and conventional photovoltaic arrays which may be bulky/large having rough and/or ragged edges.

The inventive system 100 having tube 101, which acts as a protective cover, is not limited to this particular cross-sectional shape. Other cross-sectional shapes for the tube 101 which may provide for low wind drag include, but are not limited to, substantially rectangular with rounded corners, elliptical, semi-circular, substantially circular, pentagonal, octagonal, and other like polyhedronal shapes.

Subsequently, in block 1715, the one or more solar cells 102 secured to the pivot base 110 are positioned within the tube 101. The one or more solar cells 102 and the pivot base our then secured within the tube 101 in block 1720.

Next, in block 1725, a longitudinal axis adjustment system, which may include a longitudinal axis motor 104, may be coupled to the one or more cells 102 and the tube 101. Next, in block 1730, each end of the tube 101 is sealed with a removable end cap 128. Then, in block 1735, a support structure 103 is coupled to the tube 101.

In block 1740, the entire system 100 is fastened to a building. Usually, the system 100 is fastened to a rooftop of a building. However, other mounting applications and types are included within the scope of this disclosure. For example, the system 100 may be mounted to a side of the building or in other structure such as an antenna pole, a telephone pole, etc.

After the system 100 is mounted, in block 1745, the system 100 may track sunlight with its optical sensors 116, 117 in order to optimize the electrical energy power generation output of each solar cell 102. The system 100 is designed such that the angle of incidence of sunlight relative to each cell 102 is approximately 90.0° as understood by one of ordinary skill in the art.

Next, in block 1750, each transverse axis motor 106 and longitudinal axis motor 104 may be powered by the energy generated by the one or more cells 102 under control of the controller 133. Next, in block 1755, the electrical energy generated from the one or more solar cells 102 may be stored in a storage unit 119. As noted previously, the energy storage unit 119 may comprise any one or a combination of energy storage technologies, such as, but not limited to, a lead acid battery array, a fuel cell, a large mechanical flywheel, and the like as understood by one of ordinary skill the art. The electrical energy may also be fed directly into the building or the electrical power grid in close proximity in order to power devices within and/or coupled to the building.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Therefore, although selected aspects have been illustrated and described in detail, it will be understood that various substitutions and alterations may be made therein without departing from the spirit and scope of the present invention, as defined by the following claims.

What is claimed is:

1. A wind load resistant, tracking photovoltaic solar array system comprising:
    a pivot support;
    a solar cell coupled to the pivot support, wherein the solar cell comprises a photovoltaic cell for producing electrical energy;
    a pivot arm coupled to the solar cell and for providing transverse movement of the solar cell relative to a longitudinal axis of the pivot support;
    a transverse drive motor coupled to the pivot arm and for rotating the pivot arm in response to control signals;
    a tube for housing the solar cell, pivot arm, and the transverse drive motor;
    a support structure coupled to the tube and for mounting the tube against another structure;
    a cleaning device coupled to the support structure and for dispensing a fluid to clean an exterior surface of the tube;
    a longitudinal axis drive motor coupled to the tube and the support structure, the longitudinal axis drive motor rotating the tube around a geometrical longitudinal axis of the tube in response to control signals; and
    at least one electrical coupling for the solar cell which serves both as a conductor for carrying electrical current in addition for providing mechanical movement of the solar cell, the electrical coupling comprises an electrical cable for supporting electrical current and a ball-and-socket joint for promoting mechanical movement of the solar cell.

2. The solar array system of claim 1, further comprising a controller coupled to at least one of the transverse axis drive motor and the longitudinal axis drive motor.

3. The solar array system of claim 2, further comprising at least one optical sensor coupled to the controller.

4. The solar array system of claim 1, wherein each motor is powered by energy generated by the solar cell.

5. The solar array system of claim 1, further comprising an energy storage unit coupled to the solar cell for storing energy.

6. The solar array system of claim 1, wherein the system is provided as a kit for mounting on a building.

7. A method for providing a wind load resistant, tracking photovoltaic solar array system comprising:
    mounting a solar cell with a transverse axis adjustment system on a pivot base, wherein the solar cell comprises a photovoltaic cell for producing electrical energy;
    providing a tube with a wind load resistant geometry;
    positioning the solar cell on a pivot base within the tube;
    securing the solar cell within the tube;
    coupling a longitudinal axis adjustment system to the cell and the tube;
    providing at least one electrical coupling for the solar cell which serves both as a conductor for carrying electrical current in addition for providing mechanical movement of the solar cell, the electrical coupling comprises an electrical cable for supporting electrical current and a ball-and-socket joint for promoting mechanical movement of the solar cell;
    sealing ends of the tube with end caps;
    securing a support structure to the tube;
    coupling a cleaning device coupled to the support structure; and
    dispensing a fluid to clean an exterior surface of the tube with the cleaning device.

8. The method of claim 7, further comprising: fastening the solar array system to a building.

9. The method of claim 7, further comprising: tracking sunlight with optical sensors within the tube in order to optimize power output of the solar array system.

10. The method of claim 7, further comprising: powering at least one of the transverse axis adjustment system and longitudinal axis adjustment system with the solar cell.

11. The method of claim 7, further comprising: storing power generated by the solar cell with a storage unit.

12. The method of claim 7, further comprising: packaging the solar array system as a kit for installation on a roof of a building.

13. A system for providing a wind load resistant, tracking photovoltaic solar array system comprising:
    means for mounting a solar cell with a transverse axis adjustment system on a pivot base, wherein the solar cell comprises a photovoltaic cell for producing electrical energy;
    means for providing a tube with a wind load resistant geometry;

means for positioning the solar cell on a pivot base within the tube;

means for securing the solar cell within the tube;

means for promoting mechanical movement of the solar cell, the mechanical movement promoting means comprising at least one electrical coupling for the solar cell which serves both as a conductor for carrying electrical current in addition to providing mechanical movement of the solar cell, the electrical coupling comprises an electrical cable for supporting electrical current and a ball-and-socket joint for facilitating movement;

means for coupling a longitudinal axis adjustment system to the cell and the tube;

means for sealing ends of the tube;

means for securing a support structure to the tube; and means for cleaning an exterior surface of the tube, the cleaning means comprising a fluid dispenser for dispensing a fluid to clean an exterior surface of the tube with the cleaning device.

14. The system of claim 13, further comprising: means for fastening the solar array system to a building.

15. The system of claim 13, further comprising: means for tracking sunlight within the tube in order to optimize power output of the solar array system.

16. The system of claim 13, further comprising: means for powering at least one of the transverse axis adjustment system and longitudinal axis adjustment system.

17. The system of claim 13, further comprising: means for storing power generated by the solar cell.

* * * * *